United States Patent
Lee et al.

(10) Patent No.: US 11,980,052 B2
(45) Date of Patent: May 7, 2024

(54) METASURFACE, LIGHT-EMITTING DEVICE INCLUDING THE METASURFACE, DISPLAY DEVICE INCLUDING THE LIGHT-EMITTING DEVICE, AND METHOD OF FABRICATING THE METASURFACE

(71) Applicant: SAMSUNG ELECTRONICS CO., LTD., Suwon-si (KR)

(72) Inventors: Sunghoon Lee, Seoul (KR); MyongJong Kwon, Suwon-si (KR); Wonjae Joo, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 190 days.

(21) Appl. No.: 17/154,165

(22) Filed: Jan. 21, 2021

(65) Prior Publication Data
US 2022/0020963 A1 Jan. 20, 2022

(30) Foreign Application Priority Data
Jul. 17, 2020 (KR) .................. 10-2020-0089168

(51) Int. Cl.
| | |
|---|---|
| *H10K 50/854* | (2023.01) |
| *H10K 50/15* | (2023.01) |
| *H10K 50/16* | (2023.01) |
| *H10K 50/17* | (2023.01) |
| *H10K 50/80* | (2023.01) |
| *H10K 71/00* | (2023.01) |

(52) U.S. Cl.
CPC .......... *H10K 50/854* (2023.02); *H10K 50/15* (2023.02); *H10K 50/16* (2023.02); *H10K 50/171* (2023.02); *H10K 50/868* (2023.02); *H10K 71/00* (2023.02)

(58) Field of Classification Search
None
See application file for complete search history.

(56) References Cited

U.S. PATENT DOCUMENTS

| | | | |
|---|---|---|---|
| 2002/0036828 A1 | 3/2002 | Wong | |
| 2012/0286258 A1* | 11/2012 | Naraoka | C09B 1/00 257/40 |
| 2017/0092705 A1* | 3/2017 | Lim | H01L 27/326 |
| 2018/0030278 A1 | 2/2018 | Fontana et al. | |
| 2018/0342707 A1* | 11/2018 | Lee | H01L 51/0097 |
| 2019/0196267 A1 | 6/2019 | Yoo et al. | |
| 2019/0348624 A1* | 11/2019 | Kim | H01L 27/3276 |
| 2020/0014464 A1 | 1/2020 | Shrekenhamer et al. | |
| 2021/0240052 A1 | 8/2021 | Uenoyama et al. | |

FOREIGN PATENT DOCUMENTS

| | | |
|---|---|---|
| JP | 2019200251 A | 11/2019 |
| KR | 1020190077139 A | 7/2019 |

* cited by examiner

*Primary Examiner* — Daniel Whalen
(74) *Attorney, Agent, or Firm* — Sughrue Mion, PLLC

(57) ABSTRACT

A metasurface includes a substrate with a first surface area having first surface energy, and a second surface area formed to surround the first surface area and having second surface energy less than the first surface energy, a polymer layer provided on the substrate at a position corresponding to the first surface area and including a polymer material and a metal reflective layer provided on the polymer layer and having a phase modulation surface including metal.

19 Claims, 16 Drawing Sheets

METASURFACE, LIGHT-EMITTING DEVICE INCLUDING THE METASURFACE, DISPLAY DEVICE INCLUDING THE LIGHT-EMITTING DEVICE, AND METHOD OF FABRICATING THE METASURFACE

CROSS-REFERENCE TO RELATED APPLICATION

This application is based on and claims priority under 35 U.S.C. § 119 to Korean Patent Application No. 10-2020-0089168, filed on Jul. 17, 2020, in the Korean Intellectual Property Office, the disclosure of which is incorporated by reference herein in its entirety.

BACKGROUND

1. Field

The disclosure relates to a metasurface, a light emitting device including the metasurface, a display device including the light emitting device, and a method of fabricating the metasurface.

2. Description of the Related Art

A metasurface is an optical element including optical scatters or optical thin films having a sub-wavelength dimension to control characteristics such as phase, intensity, and polarization of light. Recently, metasurface related technologies are in the spotlight as new technologies to overcome the limitations of existing optical devices that control light depending on the diffraction or refraction characteristics of light. For example, in the case of a metal metasurface that utilizes a surface plasmon characteristic in which the vibration of free electrons is concentrated at a metal-dielectric boundary, benefits and advantages of the metal metasurface is high because of its ability to trap a strong electromagnetic field at a scale beyond the diffraction limit.

In order to apply a metal metasurface to a system driven by pixel units such as a display device and a light-receiving sensor, it is necessary to implement optically independent characteristics for each pixel with respect to the metal metasurface and to enable electrically independent driving to the pixel units.

Furthermore, a method of fabricating a metal metasurface by combining an etching technique with a nano patterning technique such as photolithography/electron beam lithography is known. However, the method of fabricating a metal metasurface has limitations in that it is not easy to etch metal at a sub-wavelength dimension, and stability of the metal metasurface may be deteriorated due to changes in the properties of metal caused by chemical substances required for etching during an etching process.

SUMMARY

Provided is a metasurface including a plurality of pixels that are electrically insulated, that are capable of independent driving and have improved stability, Also, provided are a light-emitting device including the metasurface, a display device including the light-emitting device, and a method of fabricating the metasurface.

Additional aspects will be set forth in part in the description which follows and, in part, will be apparent from the description, or may be learned by practice of the presented embodiments of the disclosure.

According to an aspect of the disclosure, there is provided a metasurface comprising: a substrate including a first surface area having first surface energy, and a second surface area surrounding the first surface area and having second surface energy less than the first surface energy; a polymer layer provided on the first surface area of the substrate, the polymer layer including a polymer material; and a metal reflective layer provided on the polymer layer and having a phase modulation surface including a metal material.

The polymer layer is not provided in the second surface area.

The polymer layer may include a plurality of polymer nanostructures made of the polymer material.

The plurality of polymer nanostructures may include a UV-curable resin.

The phase modulation surface of the metal reflective layer may include a plurality of metal nanostructures corresponding to the plurality of polymer nanostructures.

The metal reflective layer may include silver (Ag) or an alloy containing Ag.

The first surface area may include a first sub-surface area and a second sub-surface area, which are spaced apart from each other by the second surface area.

The polymer layer may include a first polymer layer provided on the first sub-surface area and a second polymer layer provided on the second sub-surface area, the first polymer layer includes a plurality of first polymer nanostructures arranged according to a first rule, and the second polymer layer includes a plurality of second polymer nanostructures arranged according to a second rule different from the first rule, and the plurality of first polymer nanostructures and the plurality of second polymer nanostructures are made of the polymer material.

The metal reflective layer may include a first metal reflective layer covering the first polymer layer and a second metal reflective layer covering the second polymer layer, and a first phase modulation surface of the first metal reflective layer may include a plurality of first metal nanostructures corresponding to the plurality of first polymer nanostructures, and a second phase modulation surface of the second metal reflective layer may include a plurality of second metal nanostructures corresponding to the plurality of second polymer nanostructures.

The first surface area may further include a third sub-surface area, the polymer layer further includes a third polymer layer provided on the third sub-surface area, and the metal reflective layer may further include a third metal reflective layer provided on the third polymer layer and including a flat third phase modulation surface.

According to another aspect of the disclosure, there is provided a light emitting device comprising: a polymer layer including a polymer material; a metal reflective layer provided on the polymer layer and having a phase modulation surface including a metal material; a first electrode provided on the metal reflective layer; a light emitting structure provided on the first electrode; and a second electrode provided on the light emitting structure.

The polymer layer may include a plurality of polymer nanostructures, and the phase modulation surface of the metal reflective layer may include a plurality of metal nanostructures corresponding to the plurality of polymer nanostructures.

The light emitting structure may comprises a hole injection layer provided on the first electrode; a hole transfer layer provided on the hole injection layer; an organic emission layer provided on the hole transfer layer; an electron transfer layer provided on the organic emission layer; and an electron injection layer provided on the electron transfer layer.

The first electrode may be a transparent electrode, and the second electrode may be a transflective electrode configured to reflect a portion of light and allow another portion of the light to pass through.

According to another aspect of the disclosure, there is provided a display device providing a substrate including a first surface area including a first sub-surface area and a second sub-surface area having first surface energy, and a second surface area surrounding the first surface area and having second surface energy less than the first surface energy, the display device comprising: a first pixel configured to emit light of a first wavelength provided on the first sub-surface area; and a second pixel configured to emit light of a second wavelength provided on the second sub-surface area, the second wavelength being different from the first wavelength and is provided on the second sub-surface area, wherein each of the first pixel and the second pixel comprises: a polymer layer having a plurality of polymer nanostructures; a metal reflective layer provided on the polymer layer and having a phase modulation surface including a plurality of metal nanostructures corresponding to the plurality of polymer nanostructures; a first electrode provided on the metal reflective layer; a light emitting structure provided on the first electrode; and a second electrode provided on the light emitting structure.

The first pixel and the second pixel may be provided on the same plane of the substrate, and the first pixel and the second pixel may be spaced apart from each other by the second surface area such that the polymer layer and the metal reflective layer included in the first pixel and the polymer layer and the metal reflective layer included in the second pixel are electrically insulated from each other.

The display device may further comprise a driving circuit layer provided in the substrate and including a plurality of transistors corresponding to each of the first and second pixels and configured to apply a voltage between the first electrode and the second electrode.

The plurality of transistors may be electrically connected to the first electrode or the second electrode through the second surface area.

The metal reflective layer and the second electrode form a micro-cavity having a resonance wavelength, a first diameter and a first height of each of the plurality of metal nanostructures included in the first pixel, and first arrangement intervals of the plurality of metal nanostructures are configured based on a resonance wavelength of a first micro-cavity of the first pixel corresponds to the first wavelength, and a second diameter and a second height of each of the plurality of metal nanostructures included in the second pixel, and second arrangement intervals of the plurality of metal nanostructures configured based on a resonance wavelength of a second micro-cavity of the second pixel corresponding to the second wavelength.

The first surface area may further include a third sub-surface area, and the display device may further comprise a third pixel that emits light of a third wavelength different from the first and second wavelengths and is provided on the third sub-surface area, wherein the third pixel may comprises a third polymer layer including a polymer material and having a flat upper surface; a third metal reflective layer provided on the polymer layer and having a flat phase modulation surface; a third electrode provided on the metal reflective layer; a third light emitting structure provided on the third electrode; and a fourth electrode provided on the third light emitting structure.

According to another aspect of the disclosure, there is provided a method of fabricating a metasurface, the method comprising: forming a first surface area having first surface energy and a second surface area having second surface energy lower than the first surface energy through selective surface treatment on a substrate; forming a polymer layer including a polymer material on the first surface area; and forming a metal reflective layer having a phase modulation surface including a metal material on the polymer layer.

The surface treatment may include Self Assembling Monolayers (SAM) surface treatment.

The forming the first surface area and the second surface area on the substrate may comprises forming a first sub-surface area and a second sub-surface area included in the first surface area, and the second surface area surrounding the first surface area.

The forming the polymer layer may comprise forming a first polymer layer including a plurality of first polymer nanostructures arranged according to a first rule on the first sub-surface area, and forming a second polymer layer including a plurality of second polymer nanostructures arranged according to a second rule different from the first rule on the second sub-surface area.

The forming the polymer layer may comprise providing a UV-curable resin on the first surface area and performing an imprint process to form the plurality of first and second polymer nanostructures.

The forming the first surface area and the second surface area on the substrate may further include forming a third sub-surface area included in the first surface area and different from the first sub-surface area and the second sub-surface area, and the forming the polymer layer further includes forming a third polymer layer having a flat upper surface on the third sub-surface area.

The forming the metal reflective layer may comprises depositing a metal material on the polymer layer.

According to another aspect of the disclosure, there is provided a metasurface comprising: a substrate including a first surface area and a second surface area surrounding the first surface area; a polymer layer having a plurality of nanostructures provided on the first surface area of the substrate; and a metal reflective layer provided on the polymer layer and having a phase modulation surface including a metal material, wherein the polymer layer is provided only in the first surface area, among the first surface area and the second surface area.

According to another aspect of the disclosure, there is provided a method of fabricating a metasurface, the method comprising: forming a first surface area and a second surface area surrounding the first surface area on a substrate; forming a polymer layer having a plurality of nanostructures on the first surface area of the substrate; and forming a metal reflective layer on the polymer layer, the metal reflective layer having a phase modulation surface including a metal material, wherein the polymer layer is provided only in the first surface area, among the first surface area and the second surface area.

The forming the polymer layer may comprise forming a first polymer layer including a plurality of first polymer nanostructures having a first pattern on a first sub-surface area of the first surface area, and forming a second polymer layer including a plurality of second polymer nanostructures having a second pattern different from the first pattern on a second sub-surface area of first surface area.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
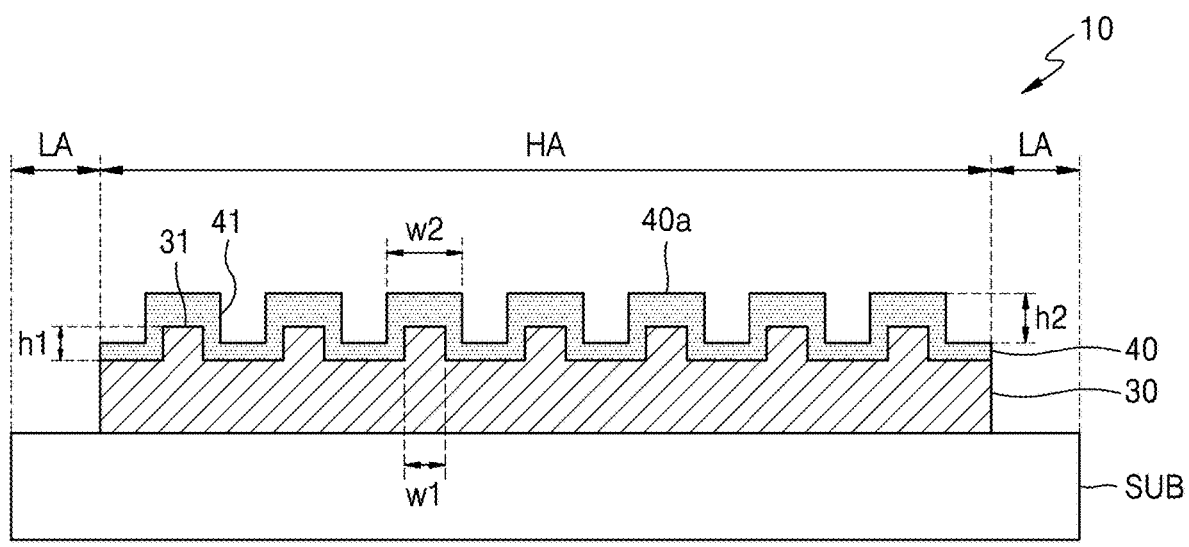
FIG. 1 is a side cross-sectional view of an example configuration of a metasurface according to an example embodiment.

Reference will now be made in detail to embodiments, examples of which are illustrated in the accompanying drawings, wherein like reference numerals refer to like elements throughout. In this regard, the example embodiments may have different forms and should not be construed as being limited to the descriptions set forth herein. Accordingly, the example embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

Hereinafter, a metasurface, a light emitting device including the metasurface, a display device including the light emitting device, and a method of fabricating the metasurface according to one or more example embodiments will be described in detail with reference to the accompanying drawings. In the following drawings, the size or thickness of each component in the drawings may be exaggerated for clarity and convenience of description.

For example, when an element is referred to as being "on" or "above" another element, it may be directly on the other element, or intervening elements may also be present. As used herein, the singular forms "a," "an," and "the" are intended to include the plural forms as well, unless the context clearly indicates otherwise. When a portion "includes" an element, another element may be further included, rather than excluding the existence of the other element, unless otherwise described.

The use of the terms "a," "an," and "the" and similar referents is to be construed to cover both the singular and the plural. Also, the operations of all methods described herein can be performed in any suitable order unless otherwise indicated herein or otherwise clearly contradicted by context. The disclosure is not limited to the described order of the operations.

It will be understood that, although the terms first, second, etc. may be used herein to describe various elements, these elements should not be limited by these terms. These components are only used to distinguish one component from another. The metasurface, the light emitting device including the metasurface, the display device including the light emitting device, and the method of fabricating the metasurface may be implemented in various different forms, and are not limited to the embodiments described herein.

Figure 2:
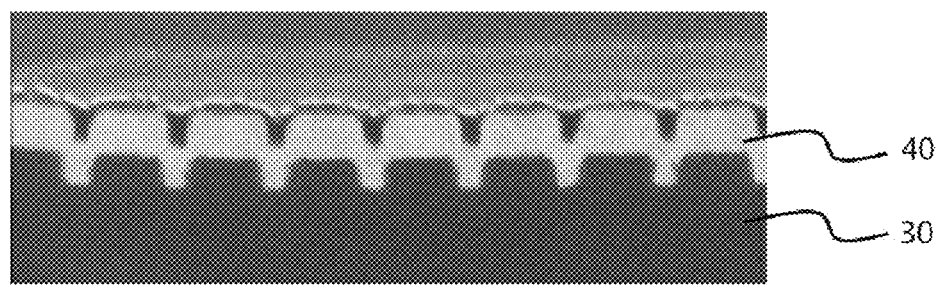
FIG. 2 is an image of an example cross-sectional side view of the metasurface of FIG. 1.
Figure 3:
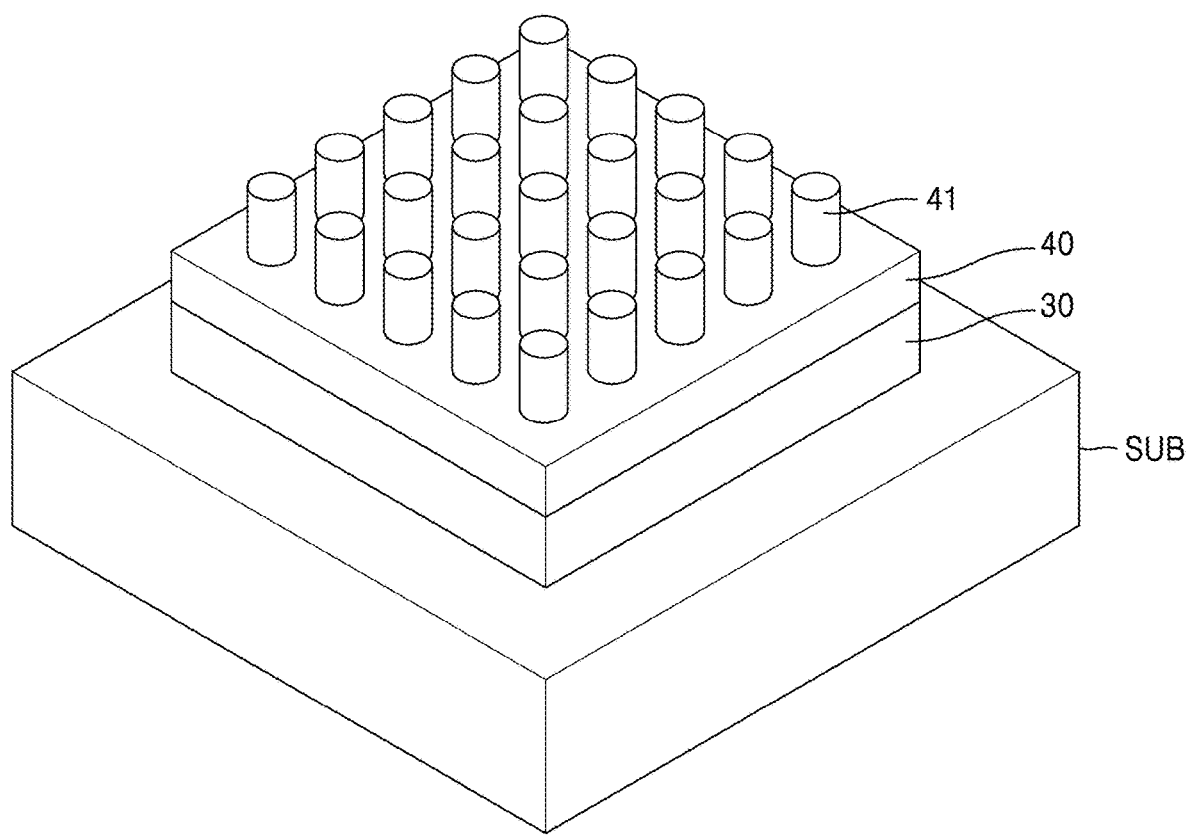
FIG. 3 is a perspective view of an example configuration of the metasurface of FIG. 1.
Figure 4:
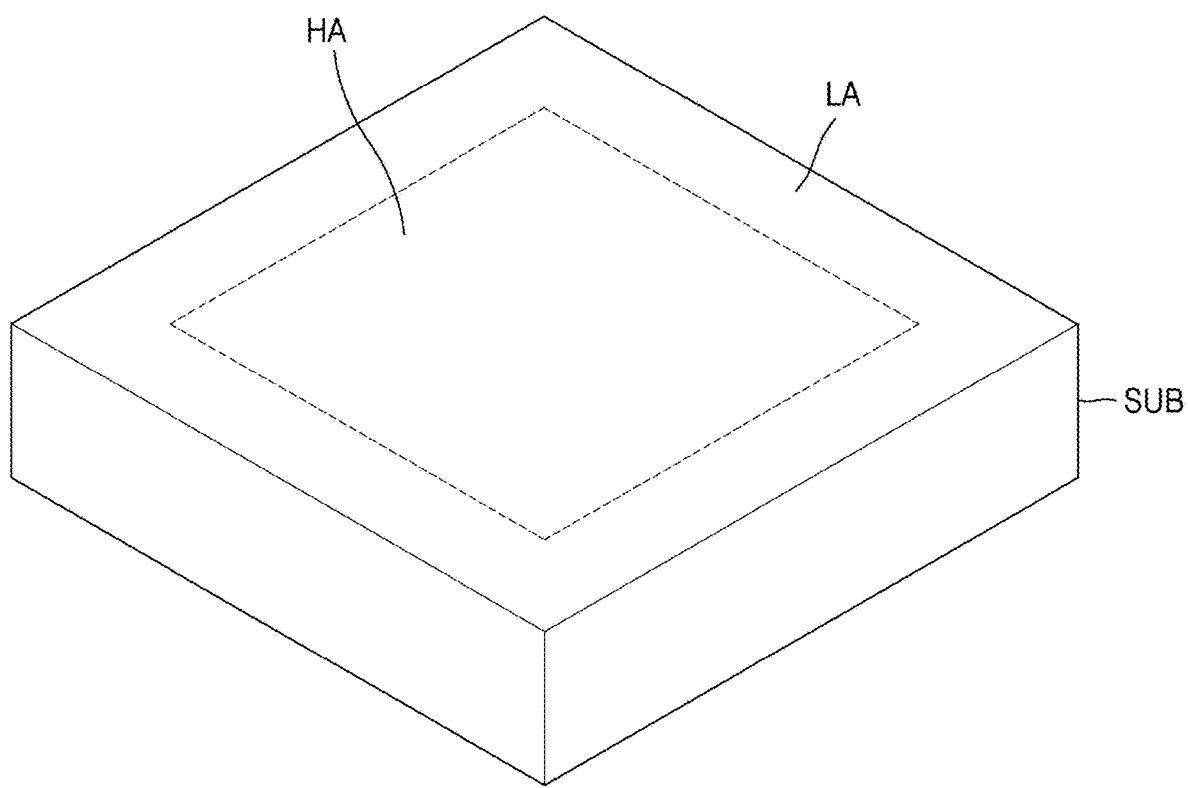
FIG. 4 is a perspective view of an example configuration of a substrate included in the metasurface of FIG. 1.

FIG. 1 is a side cross-sectional view of an example configuration of a metasurface 10 according to an example embodiment. FIG. 2 is an image of an example cross-sectional side view of the metasurface 10 of FIG. 1. FIG. 3 is a perspective view of an example configuration of the metasurface 10 of FIG. 1. FIG. 4 is a perspective view of an example configuration of a substrate SUB included in the metasurface 10 of FIG. 1.

Referring to FIG. 1, the metasurface 10 may include a substrate SUB including a first surface area HA having first surface energy and a second surface area LA formed to surround the first surface area HA and having second surface energy. According to an example embodiment, the second surface energy is lower than the first surface energy. The metasurface 10 may further include a polymer layer 30 provided on the substrate SUB at a position corresponding to the first surface area HA, and a metal reflective layer 40 provided on the polymer layer 30. The polymer layer 30 may include a polymer material and the metal reflective layer 40 may have a phase modulation surface 40a including metal.

The first surface energy may be higher than the second surface energy. For example, through selective surface treatment on the substrate SUB, some surfaces areas of the substrate SUB may have the first surface energy and some other surface areas of the substrate SUB may have the second surface energy. For example, the substrate SUB may be selectively surface-treated by Self Assembling Monolayers (SAM) surface treatment. In this case, the first surface area HA of the substrate SUB having the relatively high first surface energy may be hydrophilic. In addition, the second surface area LA of the substrate SUB having the relatively low second surface energy may be hydrophobic. As shown in FIG. 4, the second surface area LA may be provided to surround the first surface area HA.

The polymer layer 30 may be provided on the hydrophilic first surface area HA. The polymer layer 30 may not be provided in the hydrophobic second surface area LA. The polymer layer 30 may include a plurality of polymer nanostructures 31 on the upper surface. For instance, the upper surfaces of the polymer layer 30 may have the plurality of polymer nanostructures 31. However, the disclosure is not limited thereto, and the polymer layer 30 may include a flat upper surface. The entire polymer layer 30 including the plurality of polymer nanostructures 31 may include resin. For example, the entire polymer layer 30 including the plurality of polymer nanostructures 31 may include UV-curable resin.

The size of the plurality of polymeric nanostructures 31 may be less than a wavelength of incident light to the metasurface 10. In other words, the plurality of polymer nanostructures 31 may satisfy a sub-wavelength condition. For example, a first diameter w1 of each of the plurality of polymer nanostructures 31 may be about 50 nm to about 150 nm. However, the disclosure is not limited thereto, and the first diameter w1 may be less than 50 nm or greater than 150 nm. In addition, the height h1 of each of the plurality of polymer nanostructures 31 may be greater than 0 nm and less than 150 nm. However, the disclosure is not limited thereto, and the height of each of the plurality of polymer nanostructures 31 may be greater than 150 nm. Further, arrangement intervals of the plurality of polymer nanostructures 31 may be about 100 nm to about 300 nm. However, the disclosure is not limited thereto, and arrangement intervals of the plurality of polymer nanostructures 31 may be less than 100 nm or greater than 300 nm.

Each of the plurality of polymer nanostructures 31 may have various shapes. For example, each of the plurality of polymer nanostructures 31 may have a shape of a cylinder, an elliptical column, a square column, or a polygonal column having a pentagonal shape or more. As such, in some example embodiments, w1 may correspond to a width of each of the plurality of polymer nanostructures 31, which may be about 50 nm to about 150 nm.

The metal reflective layer 40 may include the phase modulation surface 40a that delays a phase of incident light with respect to the metasurface 10. The phase modulation surface 40a may include a plurality of metal nanostructures 41. However, the disclosure is not limited thereto, and the phase modulation surface 40a may include a flat upper surface. The entire metal reflective layer 40 including the plurality of metal nanostructures 41 may be made of metal. For example, the entire metal reflective layer 40 including the plurality of metal nanostructures 41 may include Ag or an alloy containing Ag.

The size of the plurality of metal nanostructures 41 may be less than a wavelength of incident light to the metasurface 10. In other words, the plurality of metal nanostructures 41 may satisfy a sub-wavelength condition. For example, a second diameter w2 of each of the plurality of metal nanostructures 41 may be about 50 nm to about 150 nm. However, the disclosure is not limited thereto, and the second diameter w2 may be less than 50 nm or greater than 150 nm. According to some other example embodiment, w2 may correspond to a width of each of the plurality of metal nanostructures 41, which may be about 50 nm to about 150 nm. In addition, the height h2 of each of the plurality of metal nanostructures 41 may be greater than 0 nm and less than 150 nm. However, the disclosure is not limited thereto, and the height of each of the plurality of metal nanostructures 41 may be greater than 150 nm. According to an example embodiment, the height of each of the plurality of metal nanostructures 41 may be same. However, the disclosure is not limited thereto, and the height of one or more of the plurality of metal nanostructures 41 may be different. Further, arrangement intervals of the plurality of metal nanostructures 41 may be about 100 nm to about 300 nm. However, the disclosure is not limited thereto, and arrangement intervals of the plurality of metal nanostructures 41 may be less than 100 nm or greater than 300 nm.

Each of the plurality of metal nanostructures 41 may have various shapes. For example, as shown in FIG. 3, each of the plurality of metal nanostructures 41 may have a cylindrical shape. However, the disclosure is not limited thereto, and each of the plurality of metal nanostructures 41 may have a shape of an elliptical column, a square column, or a polygonal column having a pentagonal shape or more.

Each of the plurality of metal nanostructures 41 may be formed to correspond to each of the plurality of polymer nanostructures 31. For example, the number of the plurality of metal nanostructures 41 and the number of the plurality of polymer nanostructures 31 may be the same, and the plurality of metal nanostructures 41 may be formed to cover the plurality of polymer nanostructures 31, respectively. In addition, the first diameter w1 of the plurality of polymer nanostructures 31 may be formed to be narrower than the second diameter w2 of the plurality of metal nanostructures 41. Further, a portion of the metal reflective layer 40 may be filled in an area between the plurality of polymer nanostructures 31. As such, an upper surface of each of the plurality of polymer nanostructures 31 may be covered by each of the plurality of metal nanostructures 41, and a portion of the metal reflective layer 40 connecting the plurality of metal nanostructures 41 to each other may be filled in an area between the plurality of polymer nanostructures 31. In other words, as shown in FIG. 2, the metasurface 10 may include a structure in which the metal reflective layer 40 is coated along the shape of an upper surface of the polymer layer 30. Moreover, as shown in FIG. 2, the metasurface 10 may include a structure in which the metal reflective layer 40 is coated along the shape of an upper surface of the polymer layer 30 and the side surfaces of the polymer layer 30.

Figure 5:
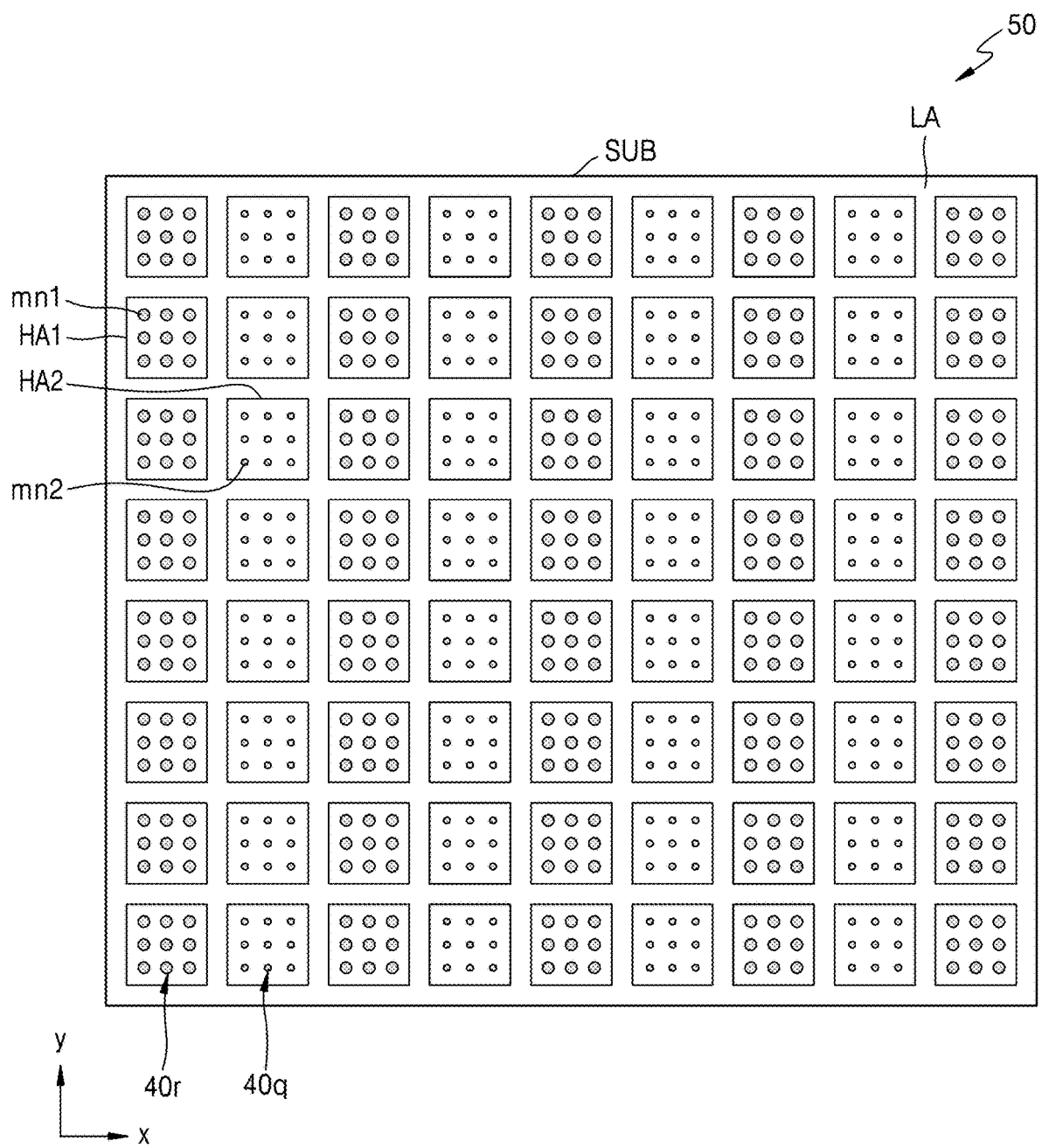
FIG. 5 is a plan view of an example configuration of a metasurface according to another embodiment.

FIG. 5 is a plan view of an example configuration of a metasurface 50 according to another example embodiment. The metasurface 50 may be substantially the same as the metasurface 10 of FIG. 1 except that first surface areas HA1 and HA2 include the first sub-surface area HA1 and the second sub-surface area HA2. In describing FIG. 5, contents overlapping with FIGS. 1 to 4 will be omitted.

Referring to FIG. 5, the metasurface 50 may include the substrate SUB having the first surface areas HA1 and HA2 having relatively high first surface energy and the second surface area LA having relatively low second surface energy. The second surface area LA may be provided to surround all four sides of the first surface areas HA1 and HA2. The relatively high first surface energy is greater than the relatively low second surface energy.

For example, the first surface areas HA1 and HA2 may include at least one first sub-surface area HA1 and at least one second sub-surface area HA2. The at least one first sub-surface area HA1 and the at least one second sub-surface area HA2 may be formed to be spaced apart from each other by the second surface area LA.

For example, the metasurface 50 may include a plurality of first sub-surface areas HA1 arranged in a row in a first direction (y-axis direction). The plurality of first sub-surface areas HA1 may be formed to be spaced apart from each other by the second surface area LA. In addition, the metasurface 50 may include a plurality of second sub-surface areas HA2 arranged in a row in the first direction (y-axis direction). The plurality of second sub-surface areas HA2 may be formed to be spaced apart from each other by the second surface area LA. A column in the first direction (y-axis direction) including the plurality of first sub-surface areas HA1 and a column in the first direction (y-axis direction) including the plurality of second sub-surface areas HA2 may be repeated side by side in a second direction (x-axis direction) to form a plurality of columns of the plurality of first sub-surface areas HA1 and a plurality of columns of the plurality of second sub-surface areas HA2. The first direction (y-axis direction) and the second direction (x-axis direction) may be perpendicular to each other. However, the disclosure is not limited thereto, and according to other example embodiments, other arrangement of the plurality of first sub-surface areas HA1 and the plurality of second sub-surface areas HA2 are possible.

When the metasurface 50 is viewed from above, a plurality of metal reflective layers 40r and 40q may be provided on the metasurface 50. For example, the metasurface 50 may include the first metal reflective layer 40r provided on the first sub-surface area HA1 and a second metal reflective layer 40q provided on the second sub-surface area HA2. Accordingly, the metasurface 50 may include a plurality of first metal reflective layers 40r arranged in a row in the first direction (y-axis direction). In addition, the metasurface 50 may include a plurality of second metal reflective layers 40q arranged in a row in the first direction (y-axis direction). A column in the first direction (y-axis direction) including the plurality of first metal reflective layers 40r and a column in the first direction (y-axis direction) including the plurality of second metal reflective layers 40q may be formed by repeating them side by side in the second direction (x-axis direction).

A first phase modulation surface of the first metal reflective layer 40r may include a plurality of first metal nanostructures mn1 arranged according to a first rule. According to the first rule, diameters, heights, and arrangement intervals of the plurality of first metal nanostructures nm1 may be determined. A second phase modulation surface of the second metal reflective layer 40q may include a plurality of second metal nanostructures mn2 arranged according to a second rule different from the first rule. According to the second rule, diameters, heights, and arrangement intervals of the plurality of second metal nanostructures nm2 may be determined. For example, the density of the first plurality of metal nanostructures mn1 arranged according to the first rule may be higher than the density of the plurality of second metal nanostructures mn2 arranged according to the second rule.

Figure 8:
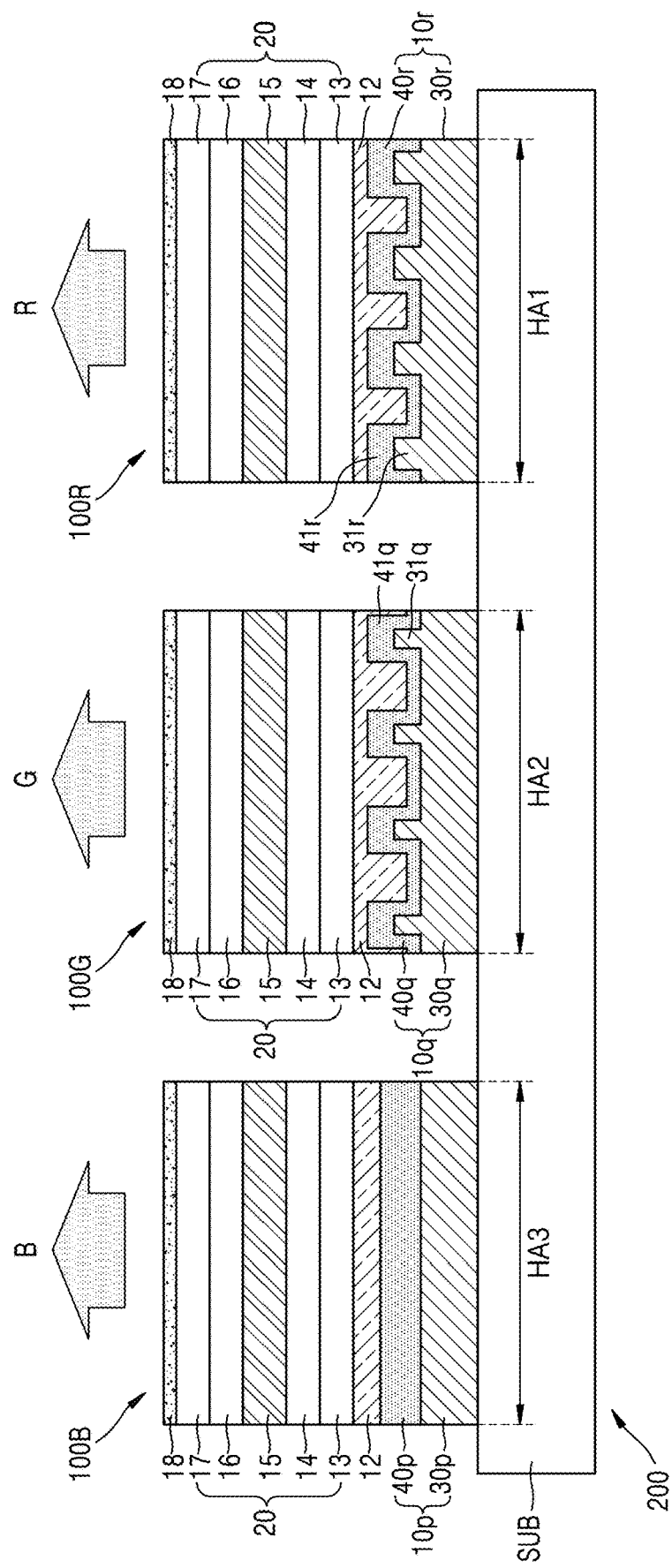
FIG. 8 is a side cross-sectional view of an example configuration of a display device according to an example embodiment.

According to an example embodiment, a first polymer layer is provided under the first metal reflective layer 40r, and a second polymer layer is provided under the second metal reflective layer 40q as illustrated in FIG. 8. For example, the first polymer layer may include polymer material as illustrated in FIGS. 1 to 4. Furthermore, the first polymer layer may include a plurality of first polymer nanostructures arranged according to a third rule. According to the third rule, diameters, heights, and arrangement intervals of the plurality of first polymer nanostructures may be determined. In addition, the second polymer layer may include polymer material and may include a plurality of second polymer nanostructures arranged according to a fourth rule. According to the fourth rule, diameters, heights, and arrangement intervals of the plurality of second polymer nanostructures nm2 may be determined. For example, the density of the plurality of first polymer nanostructures arranged according to the third rule may be higher than the density of the plurality of second polymeric nanostructures arranged according to the fourth rule. In this case, the third rule may be substantially the same as the first rule. Accordingly, the plurality of first polymer nanostructures and the plurality of first metal nanostructures mn1 may be formed to correspond to each other. Further, the fourth rule may be substantially the same as the second rule. Accordingly, the plurality of second polymer nanostructures and the plurality of second metal nanostructures mn2 may be formed to correspond to each other.

Figure 6:
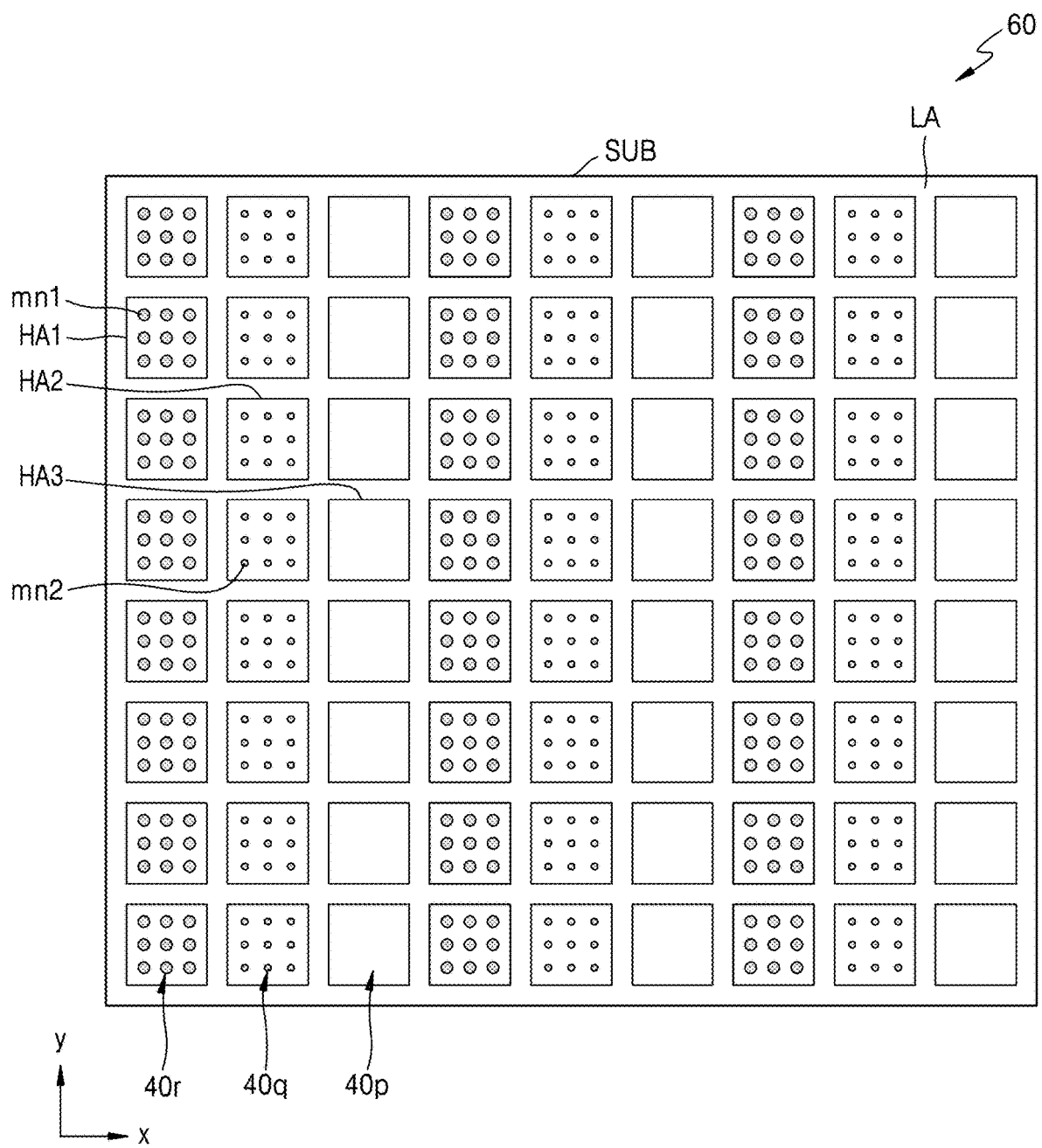
FIG. 6 is a plan view of an example configuration of a metasurface according to another embodiment.

FIG. 6 is a plan view of an example configuration of a metasurface 60 according to another example embodiment. The metasurface 60 may be substantially the same as the metasurface 50 of FIG. 5 except that a third sub-surface area HA3 is included. In describing FIG. 6, contents overlapping with FIGS. 1 to 5 will be omitted.

Referring to FIG. 6, the metasurface 60 may include the substrate SUB having the first surface areas HA1, HA2, and HA3 having relatively high first surface energy and the second surface area LA having relatively low second surface energy. The second surface area LA may be provided to surround all four sides of the first surface areas HA1, HA2, and HA3.

The first surface areas HA1, HA2, and HA3 may include at least one first sub-surface area HA1, at least one second sub-surface area HA2, and at least one third sub-surface area HA3. The at least one first sub-surface area HA1, the at least one second sub-surface area HA2, and the at least one third sub-surface area HA3 may be formed to be spaced apart from each other by the second surface area LA. Because the at least one first sub-surface area HA1 and the at least one second sub-surface area HA2 have been described with reference to FIG. 5, the at least one third sub-surface area HA3 will be described later below.

For example, the metasurface 60 may include the plurality of first sub-surface areas HA1 arranged in a row in the first direction (y-axis direction). The plurality of first sub-surface areas HA1 may be formed to be spaced apart from each other by the second surface area LA. In addition, the metasurface 60 may include a plurality of second sub-surface areas HA2 arranged in a row in the first direction (y-axis direction). The plurality of second sub-surface areas HA2 may be formed to be spaced apart from each other by the second surface area LA. In addition, the metasurface 60 may include a plurality of third sub-surface areas HA3 arranged in a row in the first direction (y-axis direction). The plurality of third sub-surface areas HA3 may be formed to be spaced apart from each other by the second surface area LA.

A column in the first direction (y-axis direction) including the plurality of first sub-surface areas HA1, a column in the first direction (y-axis direction) including the plurality of second sub-surface areas HA2, a column in the first direction (y-axis direction) including the plurality of third sub-surface areas HA3 may be repeated side by side in the second direction (x-axis direction) to form a plurality of columns of the plurality of first sub-surface areas HA1, the plurality of second sub-surface areas HA2, and the plurality of third sub-surface areas HA3. The first direction (y-axis direction) and the second direction (x-axis direction) may be perpendicular to each other.

When the metasurface 60 is viewed from above, a plurality of metal reflective layers 40r, 40q, and 40p may be provided on the metasurface 60. For example, the metasurface 60 may include the first metal reflective layer 40r provided on the first sub-surface area HA1, the second metal reflective layer 40q provided on the second sub-surface area HA2, and a third metal reflective layer 40p provided on the third sub-surface area HA3. Accordingly, the metasurface 60 may include the plurality of first metal reflective layers 40r arranged in a row in the first direction (y-axis direction). In addition, the metasurface 60 may include the plurality of second metal reflective layers 40q arranged in a row in the first direction (y-axis direction). In addition, the metasurface 60 may include a plurality of third metal reflective layers 40p arranged in a row in the first direction (y-axis direction). A column in the first direction (y-axis direction) including the plurality of first metal reflective layers 40r, a column in the first direction (y-axis direction) including the plurality of second metal reflective layers 40q, a column in the first direction (y-axis direction) including the plurality of third metal reflective layers 40p may be formed by repeating them side by side in the second direction (x-axis direction).

The third metal reflective layer 40p may include a flat third phase modulation surface. For example, the third metal reflective layer 40p may not include a plurality of metal nanostructures.

A third polymer layer may be provided under the third metal reflective layer 40p as described with reference to FIGS. 1 to 4. Like the third metal reflective layer 40p, the third polymer layer may also include a flat upper surface.

Figure 7:
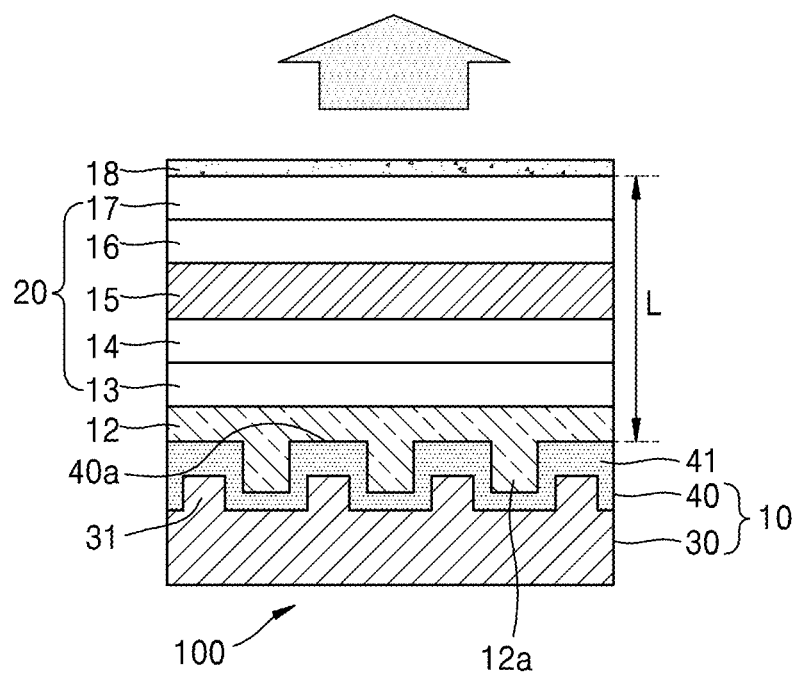
FIG. 7 is a side cross-sectional view of an example configuration of a light emitting device according to an example embodiment.

FIG. 7 is a side cross-sectional view of an example configuration of a light emitting device 100 according to an example embodiment.

Referring to FIG. 7, the light emitting device 100 may include the metasurface 10 including the polymer layer 30 containing a polymer material and the metal reflective layer 40 provided on the polymer layer 30 and having the phase modulation surface 40a including metal, a first electrode 12 provided on the metal reflective layer 40, a light emitting structure 20 provided on the first electrode 12, and a second electrode 18 provided on the light emitting structure 20. The polymer layer 30 may include the plurality of polymer nanostructures 31, and the phase modulation surface 40a of the metal reflective layer 40 may include the plurality of metal nanostructures 41 corresponding to the plurality of polymer nanostructures 31.

The metasurface 10 of FIG. 7 may be substantially the same as the metasurface 10 of FIG. 1 except that the substrate SUB is not included in the metasurface 10 of FIG. 7. Hereinafter, other components included in the light-emitting device 100 other than the metasurface 10 and functions of the light-emitting device 100 will be described in detail later below.

The light emitting device 100 may be an organic light emitting diode (OLED). For example, the light emitting structure 20 may include a hole injection layer 13 on the first electrode 12, a hole transfer layer 14 on the hole injection layer 13, an organic emission layer 15 on the hole transfer layer 14, an electron transfer layer 16 on the organic emission layer 15, and an electron injection layer 17 on the electron transfer layer 16. In addition, according to some example embodiments, the light emitting structure 20 may include various additional layers as necessary. For example, the light emitting structure 20 may further include an electron block layer between the hole transfer layer 14 and the organic emission layer 15. In addition, a hole block layer may be further included between the organic emission layer 15 and the electron transfer layer 16. In this structure, holes provided through the hole injection layer 13 and the hole transfer layer 14 and electrons provided through the electron injection layer 17 and the electron transfer layer 16 are combined in the organic emission layer 15 to generate light. A wavelength of the generated light may be determined by an energy band gap of a light emitting material of the organic emission layer 15.

However, the structure of the OLED described above is only an example of the light-emitting device 100, and the light-emitting device 100 is not limited to the OLED. For example, the structure and principle of the light-emitting device 100 according to the disclosure may be applied to an inorganic light-emitting diode. Hereinafter, for convenience, it will be described that the light emitting device 100 is an OLED.

The first electrode 12 is a transparent electrode having a property of transmitting light, and may serve as an anode providing holes. According to an example embodiment, the first electrode 12 is a transparent electrode having a property of transmitting visible light. The second electrode 18 on the light emitting structure 20 is a transflective electrode that reflects a portion of light and transmits a portion of light, and may serve as a cathode providing electrons. To this end, the first electrode 12 may include a material having a relatively high work function, and the second electrode 18 may include a material having a relatively low work function. For example, the first electrode 12 may include a transparent conductive oxide such as indium tin oxide (ITO), indium zinc oxide (IZO), and aluminum zinc oxide (AZO). In addition, the second electrode 18 may include a very thin reflective metal. For example, the second electrode 18 may be a mixed layer of silver (Ag) and magnesium (Mg) or a mixed layer of aluminum (Al) and lithium (Li), and the total thickness of the second electrode 18 may be about 10 nm to about 20 nm. Because the thickness of the second electrode 18 is very thin, some of the light may pass through the reflective metal.

The metasurface 10 configures a micro-cavity L together with the second electrode 18. In other words, the micro-cavity L is formed between the metasurface 10 and the second electrode 18 of the light emitting device 100. For example, after light generated from the light emitting structure 20 reciprocates and resonates between the metasurface 10 and the second electrode 18, and light corresponding to a resonance wavelength of the micro-cavity L may be emitted to the outside through the second electrode 18.

The resonance wavelength of the micro-cavity L may be determined by an optical length of the micro-cavity L. For example, when the resonance wavelength of the micro-cavity L is $\lambda$, the optical length of the micro-cavity L may be $n\lambda/2$ (n is a natural number). The optical length of the micro-cavity L may be determined by a sum of an optical thickness of the light emitting structure 20 and the first electrode 12, a phase delay caused by the second electrode 18, and a phase shift (e.g., phase delay) caused by the metasurface 10. Here, the optical thickness of the light-emitting structure 20 and the first electrode 12 is not a simple physical thickness, but a thickness considering refractive indexes of materials of the light-emitting structure 20 and the first electrode 12. According to an example embodiment, the optical length or the resonance wavelength of the micro-cavity L may be adjusted by only controlling the phase shift by the metasurface 10 while fixing the optical thickness of the light emitting structure 20 and the first electrode 12 and a phase delay due to the second electrode 18.

In order to control a phase shift due to the metasurface 10, the phase modulation surface 40a is formed on a reflective surface of the metal reflective layer 40 included in the metasurface 10 in contact with the first electrode 12. The phase modulation surface 40a may include a plurality of very small metal nanostructures 41 on the nanoscale. For example, each of the plurality of metal nanostructures 41 may have a pillar shape protruding from an uppermost surface of the metal reflective layer 40. For example, each of the plurality of metal nanostructures 41 may have a shape of a cylinder, an elliptical column, a square column, or a polygonal column having a pentagonal shape or more. In addition, each of the plurality of polymer nanostructures 31 included in the polymer layer 30 provided under the metal reflective layer 40 may have a shape of a cylinder, an elliptical column, a square column, or a polygonal column having a pentagonal shape or more. The plurality of polymer nanostructures 31 and the plurality of metal nanostructures 41 may have similar shapes to each other. For example, when each of the plurality of polymer nanostructures 31 has a cylindrical shape, each of the plurality of metal nanostructures 41 may also have a cylindrical shape.

In order to prevent the micro-cavity L from having polarization dependence, the plurality of metal nanostructures 41 may be regularly and periodically arranged to have a 4-fold symmetry characteristic. When the micro-cavity L has polarization dependence, only light of a specific polarization component resonates, and thus, luminous efficiency of the light-emitting device 100 may be reduced. For example, arrangement intervals of the plurality of metal nanostructures 41 may be constant. In another example embodiment, the arrangement of the plurality of metal nanostructures 41 may be designed differently from the 4-fold symmetry such that the light emitting device 100 intentionally emits only light of a characteristic polarization component.

For example, when each of the plurality of metal nanostructures 41 is cylindrical, optical properties (e.g., a phase delay of reflected light) of the phase modulation surface 40a may be determined by the diameter, height, and arrangement interval of each of the plurality of metal nanostructures 41. In addition, the diameter, height, and arrangement interval of each of the plurality of nanostructures 41 may be constant for the entire area of the phase modulation surface 40a. When each of the plurality of nanostructures 41 is, for example, a polygonal column, optical properties of the phase modulation surface 40a may be determined by the width, height, and arrangement interval of each of the plurality of nanostructures 41. In addition, the width, height, and arrangement interval of each of the plurality of nanostructures 41 may be constant for the entire area of the phase modulation surface 40a.

Accordingly, the resonance wavelength of the micro-cavity L may be determined by the diameter, height, and arrangement interval of each of the plurality of nanostructures 41. In other words, when the resonance wavelength of the micro-cavity L is $\lambda$, the diameter, height, and arrangement interval of each of the plurality of metal nanostructures 41 such that the optical length of the micro-cavity L satisfies $n\lambda/2$ (n is a natural number). For example, each of the plurality of metal nanostructures 41 may have a diameter of about 50 nm to about 150 nm. However, the disclosure is not limited thereto, and the diameter of each of the plurality of metal nanostructures 41 may be less than 50 nm or greater than 150 nm. In addition, the height of each of the plurality of metal nanostructures 41 may be greater than 0 nm and less than 150 nm. However, the disclosure is not limited thereto, and the height of each of the plurality of metal nanostructures 41 may be greater than 150 nm. Further, arrangement intervals of the plurality of metal nanostructures 41 may be about 100 nm to about 300 nm. However, the disclosure is not limited thereto, and arrangement intervals of the plurality of metal nanostructures 41 may be less than 100 nm or greater than 300 nm.

FIG. 8 is a side cross-sectional view of an example configuration of a display device 200 according to an example embodiment.

Referring to FIG. 8, the display device 200 may include the substrate SUB including the first surface areas HA1, HA2, and HA3 including the first sub-surface area HA1, the second sub-surface area HA2, and the third sub-surface area HA3 having first surface energy and a second surface area having second surface energy lower than the first surface energy and formed to surround the first surface areas HA1 HA2 and HA3, a first pixel 100R that emits light of a first wavelength provided on the first sub-surface area HA1 of the substrate sub, and a second pixel 100G that emits light having a second wavelength that is different from the first wavelength and is provided on the second sub-surface area HA2. Furthermore, the display device 200 may further include a third pixel 100B that emits light having a third wavelength that is different from the first and second wavelengths and is provided on the third sub-surface area HA3. For example, the first sub-surface area HA1, the second sub-surface area HA2, and the third sub-surface area HA3 may be arranged in a line. In FIG. 8, for convenience, only one of the first to third pixels 100R, 100G, and 100B is shown, but in reality, a very large number of first to third pixels 100R, 100G, and 100B may be repeatedly arranged.

Each of the first and second pixels 100R and 100G may include polymer layers 30r and 30q respectively including a plurality of polymer nanostructures 31r and 31q, metal reflective layers 40r and 40q provided on the polymer layers 30r and 30q and having a phase modulation surface including a plurality of metal nanostructures 41r and 41q formed to correspond to the plurality of polymer nanostructures 31r and 31q, the first electrode 12 provided on the metal reflective layers 40r and 40q, the light emitting structure 20 provided on the first electrode 12, and the second electrode 18 provided on the light emitting structure 20. In addition, the third pixel 100B may include a polymer layer 30p including a polymer material and having a flat upper surface, a metal reflective layer 40p provided on the polymer layer 30p and having a flat phase modulation surface, the first electrode 12 provided on the metal reflective layer 40p, the light emitting structure 20 provided on the first electrode 12, and the second electrode 18 provided on the light emitting structure 20. A structure in which the metal reflective layers 40r, 40q, and 40r are stacked on the polymer layers 30r, 30q, and 30r may be metasurfaces 10r, 10q, and 10p. The metasurfaces 10r, 10q, and 10p may be substantially the same as the metasurface 10 of FIG. 1 except that the substrate SUB is not included in the metasurfaces 10r, 10q, and 10p of FIG. 8. The metal reflective layers 40r, 40q, and 40p of each of the first to third pixels 100R, 100G, and 100B and the second electrode 18 may constitute a micro-cavity having a resonance wavelength.

The first to third pixels 100R, 100G, and 100B may be configured to emit light having different wavelengths. For example, the first pixel 100R may be configured to emit light R of a first wavelength band $\lambda 1$ that is a red series, the second pixel 100G may be configured to emit light G of a second wavelength band $\lambda 2$ that is a green series, and the third pixel 100B may be configured to emit light B of a third wavelength band $\lambda 3$ that is a blue series. To this end, micro-cavities of the first to third pixels 100R, 100G, and 100B may be configured to have different optical lengths.

As described above, the optical length of the micro-cavity may be determined by a sum of an optical thickness of the light emitting structure 20 and the first electrode 12, a phase delay due to the second electrode 18, and a phase shift due to the metasurfaces 10r, 10p, and 10q. According to the present embodiment, the optical length or the resonance wavelength of the micro-cavity may be adjusted by adjusting only a phase delay due to the metasurfaces 10r, 10p, and 10q while fixing the optical thickness of the light emitting structure 20 and the first electrode 12 and the phase delay due to the second electrode 18, that is, an optical distance between the metasurfaces 10r, 10p, and 10q and the second electrode 18 and the phase delay due to the second electrode 18. For example, phase delay $\varphi1$ due to the metasurface 10r of the first pixel 100R, phase delay $\varphi2$ due to the metasurface 10p of the second pixel 100G, and phase delay $\varphi3$ due to the metasurface 10r of the third pixel 100B may be configured to be different from each other.

In other words, the diameter and height of the plurality of first metal nanostructures 41r and arrangement intervals of the plurality of first metal nanostructures 41r included in the first pixel 100R may be selected such that a resonance wavelength of a micro-cavity of the first pixel 100R corresponds to a first wavelength $\lambda1$.

In addition, the diameter and height of the plurality of first metal nanostructures 41q, and arrangement intervals of the plurality of first metal nanostructures 41q included in the second pixel 100G may be selected such that a resonance wavelength of a micro-cavity of the second pixel 100G corresponds to a second wavelength $\lambda2$ different from the first wavelength $\lambda1$.

Furthermore, the optical thickness of the light emitting structure 20 and the first electrode 12 and the phase delay due to the second electrode 18 included in the third pixel 100B may be set such that a resonance wavelength of a micro-cavity of the third pixel 100B corresponds to a third wavelength $\lambda3$ different from the first and second wavelengths $\lambda1$ and $\lambda2$. As described above, the metal reflective layer 40p of the third pixel 100B according to an embodiment may include a flat upper surface and may not include a plurality of metal nanostructures. Accordingly, the resonance wavelength of the micro-cavities of the third pixel 100B may be set by setting the optical thickness of the light emitting structure 20 and the first electrode 12 and the phase delay due to the second electrode 18 included in the third pixel 100B.

As described above, the optical length of the micro-cavity may be adjusted according to the diameter and height of each of the plurality of metal nanostructures 41r and 41q and arrangement intervals of the plurality of metal nanostructures 41r and 41q. Therefore, since the optical length of the micro-cavity may be adjusted without adjusting the thickness of each of the first to third pixels 100R, 100G, and 100B differently, the display device 200 may be formed or manufactured to have physical thicknesses of the first to third pixels 100R, 100G, and 100B to be the same. For example, in the first to third pixels 100R, 100G, and 100B, lengths between the second electrode 18 and the metasurfaces 10r, 10p, and 10q may all be the same. Accordingly, a manufacturing process of the display device 200 is simplified, and thus, it may be easy to increase the area of the display device 200.

Meanwhile, organic emission layers 15 of the first to third pixels 100R, 100G, and 100B may be configured differently. For example, the organic light-emitting layer 15 of the first pixel 100R may include a light-emitting material that generates red-based light, the organic emission layer 15 of the second pixel 100G includes a light emitting material that generates green-based light, and the organic emission layer 15 of the third pixel 100B may include a light emitting material that generates blue-based light. However, the disclosure is not limited thereto, and the organic emission layers 15 of the first to third pixels 100R, 100G, and 100B may be configured identically to each other. For example, the organic emission layers 15 of the first to third pixels 100R, 100G, and 100B may include all of the light-emitting material that generates red-based light, the light-emitting material that generates green-based light, and the light-emitting material that generates blue-based light. When the organic emission layers 15 of the first to third pixels 100R, 100G, 100B are the same, the manufacturing process of the display device 200 may be simplified.

The first pixel 100R, the second pixel 100G, and the third pixel 100B may be provided on the same plane of the substrate SUB to be spaced apart from each other. For example, the first pixel 100R may be provided in the first sub-surface area HA1, the second pixel 100G may be provided in the second sub-surface area HA2, and the third pixel 100B may be provided in the third sub-surface area HA3. An area in which the first sub-surface area HA1, the second sub-surface area HA2, and the third sub-surface area HA3 are not provided on the substrate SUB may be the second surface area. The first sub-surface area HA1, the second sub-surface area HA2, and the third sub-surface area HA3 formed to be spaced apart from each other may be areas surrounded by the second surface area. Accordingly, the first pixel 100R, the second pixel 100G, and the third pixel 100B may be formed to be spaced apart from each other by the second surface area. In this way, the first pixel 100R, the second pixel 100G, and the third pixel 100B formed to be spaced apart from each other by the second surface area may be electrically insulated from each other. Accordingly, the metasurface 10r including the polymer layer 30r and the metal reflective layer 40r included in the first pixel 100R, the metasurface 10q including the polymer layer 30q and the metal reflective layer 40q included in the second pixel 100G, and the metasurface 10p including the polymer layer 30p and the metal reflective layer 40p included in the third pixel 100B may be electrically insulated from each other.

According to an example embodiment, a driving circuit layer including a plurality of transistors respectively corresponding to the first pixel 100R, the second pixel 100G, and the third pixel 100B may be further provided under the substrate SUB to apply a voltage between the first electrode 12 and the second electrode 18. The plurality of transistors may be electrically connected to the first electrode 12 or the second electrode 18 through a via formed through the second surface area of the substrate SUB. According to an example embodiment, since the driving circuit layer is connected to the first electrode 12 or the second electrode 18 through the second surface area that electrically insulates the metasurface 10r of the first pixel 100R, the metasurface 10q of the second pixel 100G, and the metasurface 10p of the third pixel 100B, a voltage from the driving circuit layer may not be applied to the metasurfaces 10r, 10p, and 10q. Accordingly, stable electrical independent driving of the first pixel 100R, the second pixel 100G, and the third pixel 100B may be possible.

Figure 9:
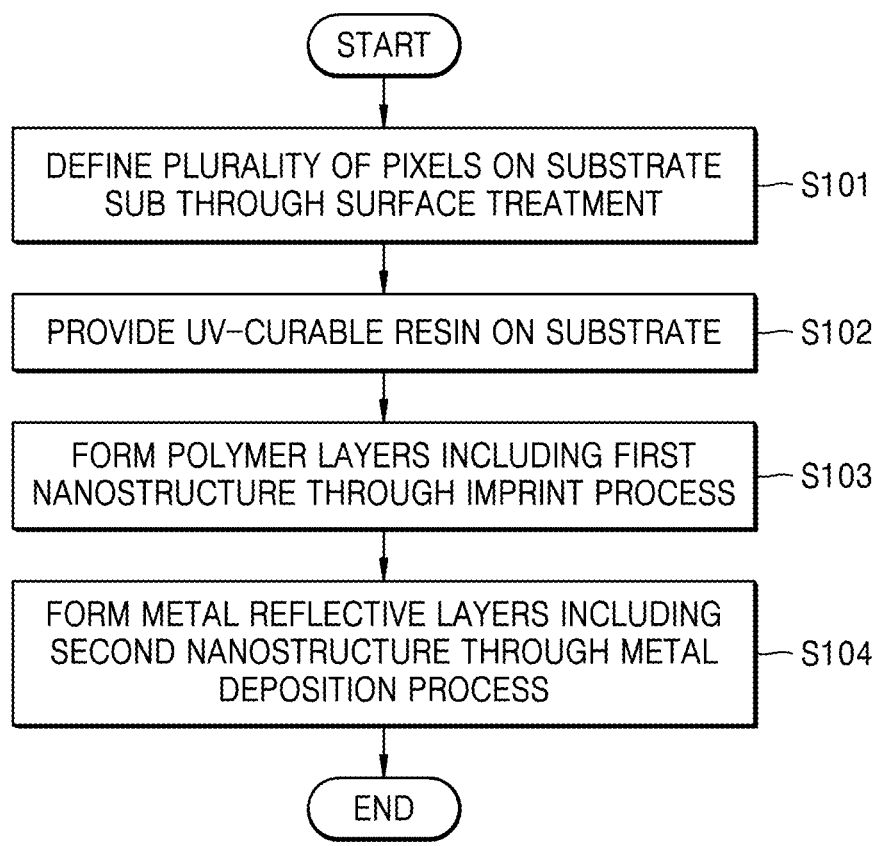
FIG. 9 is a flowchart illustrating a method of fabricating a metasurface according to an example embodiment.
Figure 10:
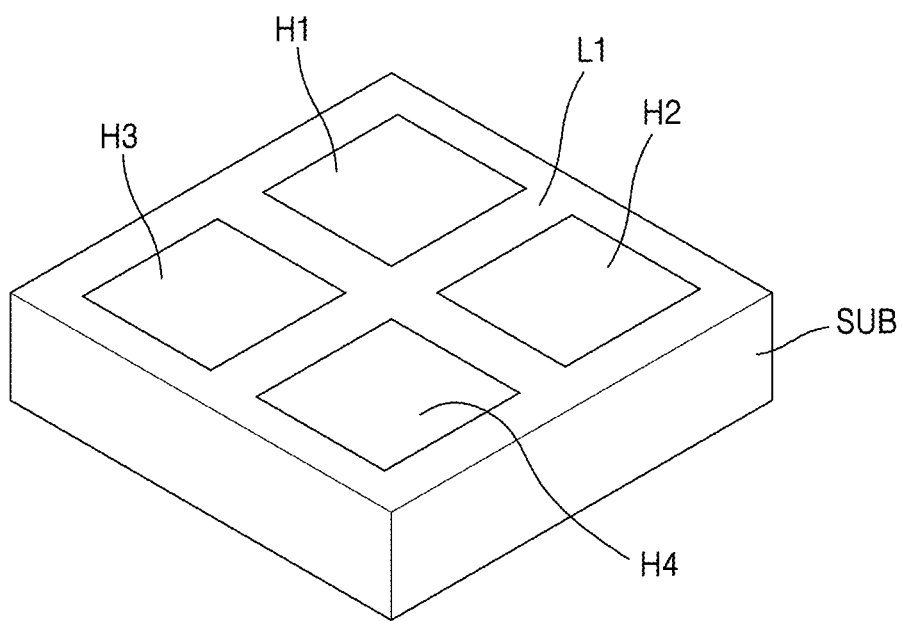
FIG. 10 is a view illustrating a method of defining a plurality of pixels on a substrate according to a method of fabricating a metasurface according to an example embodiment.
Figure 11:
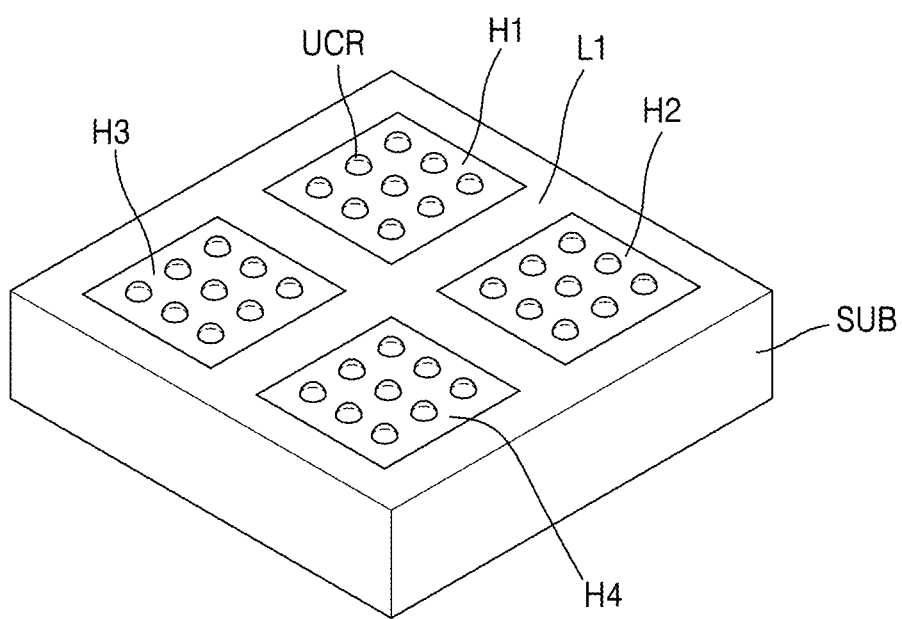
FIG. 11 is a view illustrating a method of providing a polymer material on a substrate according to a method of fabricating a metasurface according to an example embodiment.
Figure 12:
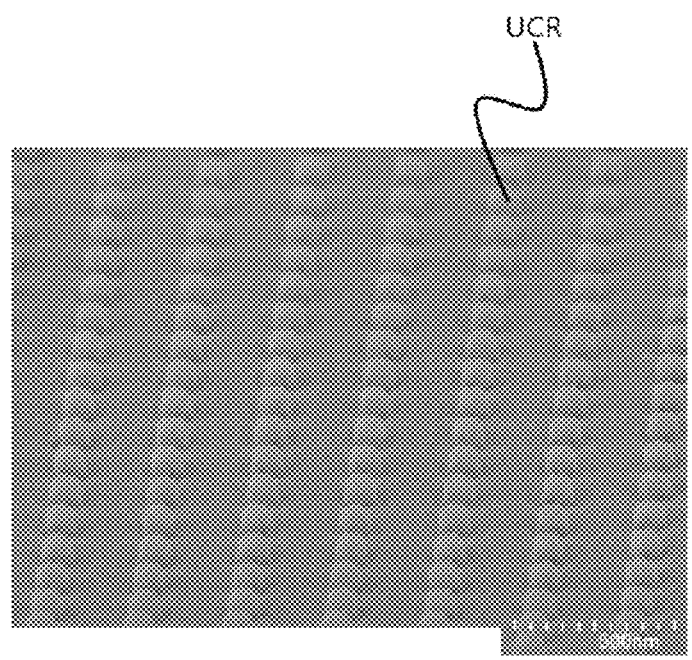
FIG. 12 is an example image of a polymer material droplet formed on a substrate according to the method of providing the polymer material of FIG. 11.
Figure 13:
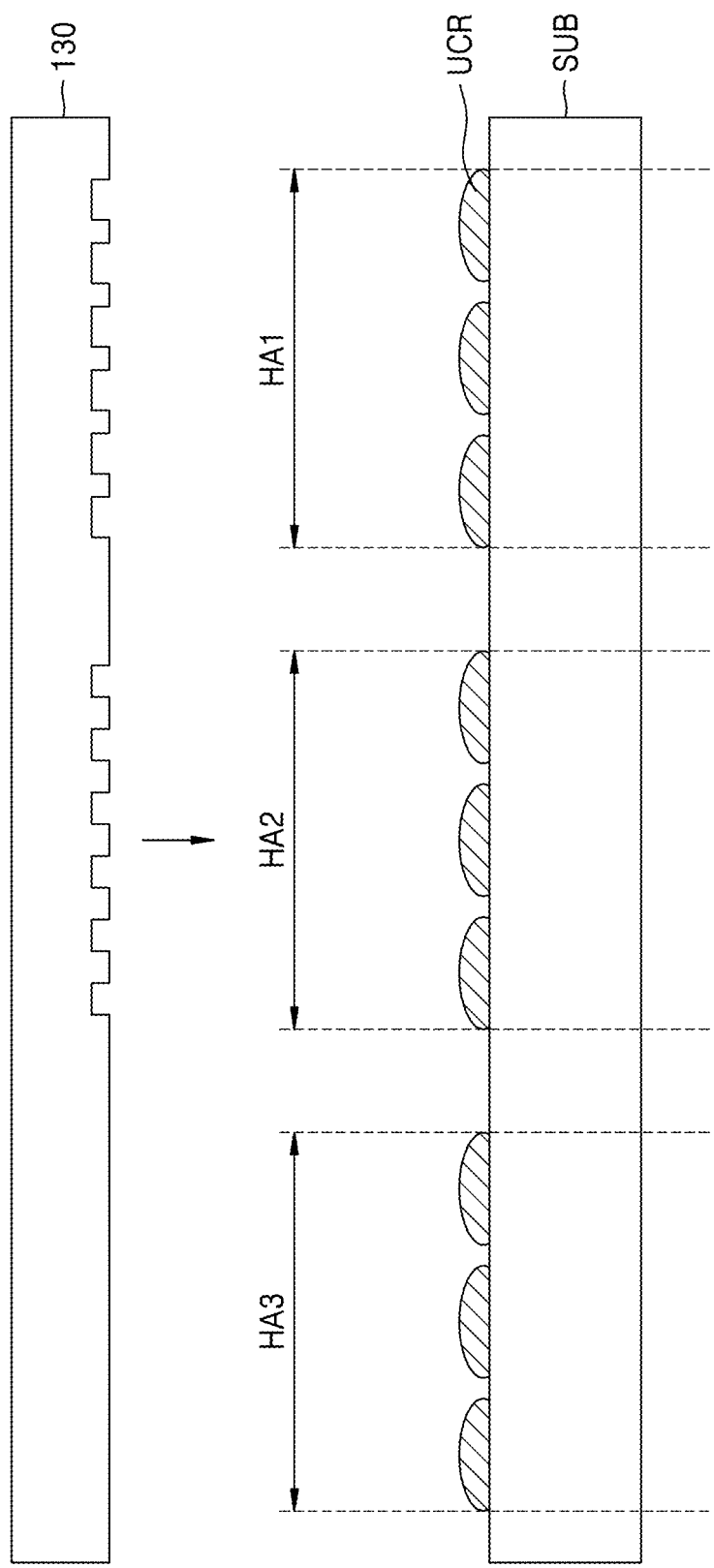
FIG. 13 is a view illustrating a method of performing an imprint process on a substrate on which a polymer material droplet is provided according to a method of fabricating a metasurface according to an example embodiment.
Figure 14:
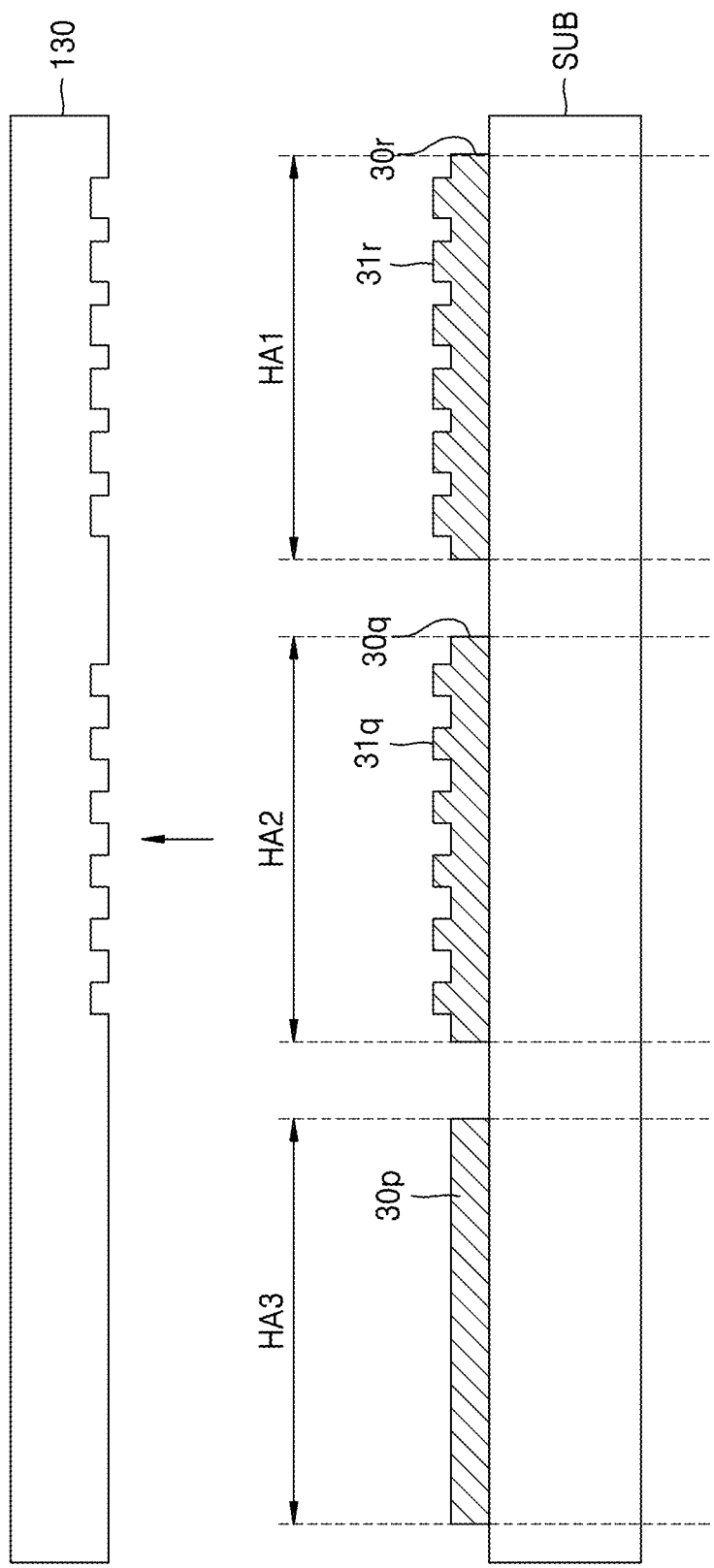
FIG. 14 is a view illustrating a method of forming a polymer layer through an imprint process on a substrate according to a method of fabricating a metasurface according to an example embodiment.
Figure 15:
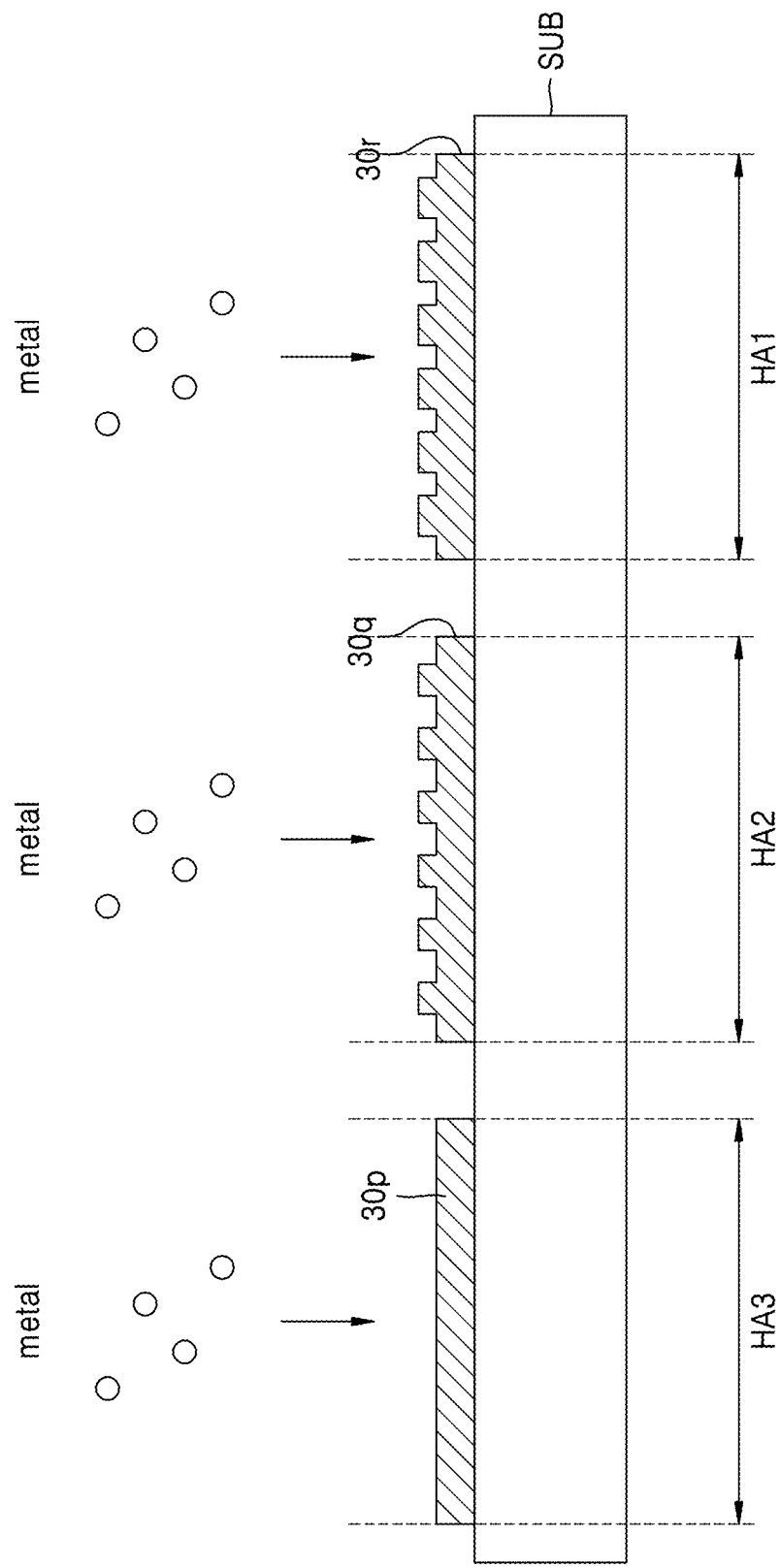
FIG. 15 is a view illustrating a method of performing metal deposition on a polymer layer according to a method of fabricating a metasurface according to an example embodiment.
Figure 16:
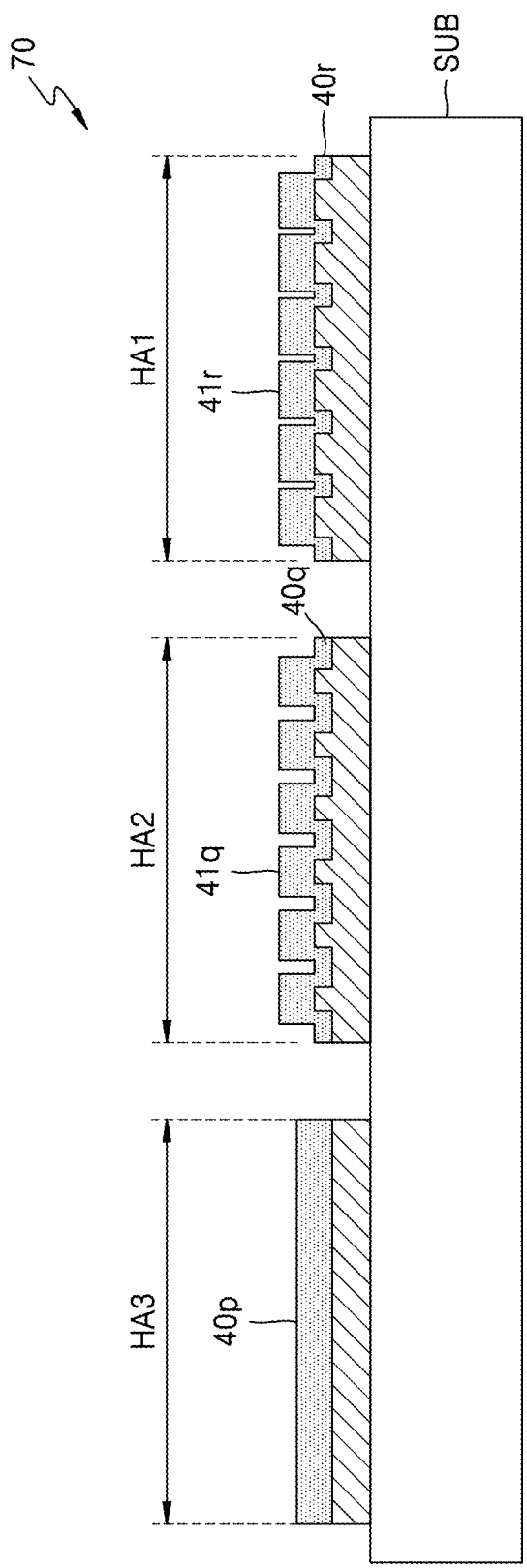
FIG. 16 is a view illustrating an example configuration of a metasurface formed according to a method of fabricating a metasurface according to an example embodiment.

FIG. 9 is a flowchart illustrating a method of fabricating a metasurface according to an example embodiment. FIG. 10 is a view illustrating a method of defining a plurality of pixels on a substrate according to a method of fabricating a metasurface according to an example embodiment; FIG. 11 is a view illustrating a method of providing a polymer material on a substrate according to a method of fabricating a metasurface according to an example embodiment. FIG. 12 is an example image of a polymer material droplet formed on a substrate according to the method of providing the polymer material of FIG. 11. FIG. 13 is a view illustrating a method of performing an imprint process on a substrate on which a polymer material droplet is provided according to a method of fabricating a metasurface according to an example embodiment. FIG. 14 is a view illustrating a method of forming the polymer layers 30p, 30q, and 30r through an imprint process on a substrate according to a method of fabricating a metasurface according to an example embodiment. FIG. 15 is a view illustrating a method of performing metal deposition on the polymer layers 30p, 30q, and 30r according to a method of fabricating a metasurface according to an example embodiment. FIG. 16 is a view illustrating an example configuration of a metasurface 70 formed according to a method of fabricating a metasurface according to an example embodiment.

According to an example embodiment, the method illustrated in FIG. 9 may include a first operation S101 of providing a substrate SUB for forming a plurality of pixels. According to an example embodiment, the first operation may further include defining areas for the plurality of pixels on the substrate SUB through surface treatment. The method of FIG. 9 may further include a second operation S102 of providing a UV-curable resin on the substrate SUB, a third operation S103 of forming the polymer layers 30r, 30q, and 30r including a first nanostructure through an imprint process, and fourth operation S104 of forming the metal reflective layers 40r, 40q, and 40p having a phase modulation surface including a second nanostructure on the polymer layers 30r, 30q, and 30p through a metal deposition process.

Referring to FIG. 10, first operation S101 may include forming first surface areas H1, H2, H3, and H4 having first surface energy and a second surface area L1 having second surface energy lower than the first surface energy by dividing them through selective surface treatment on the substrate SUB. For example, optional surface treatment performed on the substrate SUB may include SAM surface treatment. For example, the SAM surface treatment may include fluorinated SAM surface treatment.

The first surface areas H1, H2, H3, and H4 may include the first sub-surface area H1, the second sub-surface area H2, the third sub-surface area H3, and the fourth sub-surface area H4 corresponding to the pixels. The first sub-surface area H1, the second sub-surface area H2, the third sub-surface area H3, and the fourth sub-surface area H4 may be surrounded by the second surface area L1. Accordingly, the first sub-surface area H1, the second sub-surface area H2, the third sub-surface area H3, and the fourth sub-surface area H4 may be formed to be spaced apart from each other by the second surface area L1. Although four first surface areas H1, H2, H3, and H4 are illustrated in FIG. 10, this is for convenience of description only, and a myriad of first surface areas may be formed on the substrate SUB.

Referring to FIG. 11, second operation S102 may include providing a polymer material on the substrate SUB including the first surface areas H1, H2, H3, and H4, and the second surface area L1 surrounding them. The polymer material may include, for example, a UV-curable resin UCR. The UV-curable resin provided on the substrate SUB may have a property of being located in the first surface areas H1, H2, H3, and H4 having relatively high surface energy. For example, the UV-curable resin may be provided in the form of droplet UCR on the first surface areas H1, H2, H3, and H4. As shown in FIG. 12, the UV-curable resin in the form of droplet UCR may be regularly distributed in the first surface areas H1, H2, H3, and H4. That is, the UV-curable resin in the form of droplet UCR may be distributed at a regular interval in the first surface areas H1, H2, H3, and H4. However, the disclosure is not limited thereto, and the UV-curable resin provided on the substrate SUB may be provided in the form of a thin film in the first surface areas H1, H2, H3, and H4 having relatively high surface energy.

Referring to FIG. 13, the third operation S103 may include performing an imprint process on the UV-curable resin distributed in the form of droplet UCR on the substrate SUB using a stamp 130. The stamp 130 may be provided in parallel with an upper portion of the substrate SUB. In this case, a first pattern may be formed in an area of the stamp 130 that faces the first sub-surface area HA1 of the substrate SUB. In addition, a second pattern may be formed in an area of the stamp 130 that faces the second sub-surface area HA2 of the substrate SUB. Furthermore, an area of the stamp 130 that faces the third sub-surface area HA3 of the substrate SUB may be flat.

For example, the first pattern and the second pattern may include an structure in which a plurality of grooves are regularly arranged. The plurality of grooves of the first pattern may be arranged according to a first rule, and the plurality of grooves of the second pattern may be arranged according to a second rule. For example, widths of the plurality of grooves included in the first pattern may be greater than widths of the plurality of grooves included in the second pattern. In this way, the imprint process may be performed by pressing the stamp 130 having different patterns for each area corresponding to the first sub-surface area HA1, the second sub-surface area HA2, and the third sub-surface area HA3 of an upper surface of the substrate SUB.

Referring to FIG. 14, when irradiating the upper surface of the substrate SUB with ultraviolet rays after pressing and removing the stamp 130 on the upper surface of the substrate sub, a UV curable resin having a modified shape according to a surface shape of the stamp 130 may be cured to form the first polymer layer 30r, the second polymer layer 30q, and the third polymer layer 30p. The first polymer layer 30r formed as described above may include the plurality of first polymer nanostructures 31r corresponding to the grooved structure of the first pattern included in the stamp 130. Accordingly, the plurality of first polymer nanostructures 31r may be arranged according to the first rule. Also, the second polymer layer 30q may include the plurality of second polymer nanostructures 31q corresponding to a grooved structure of the second pattern included in the stamp 130. Accordingly, the plurality of second polymer nanostructures 31q may be arranged according to the second rule. Furthermore, the third polymer layer 30p may include a flat upper surface. In this case, the plurality of first polymer nanostructures 31r and a plurality of second polymer nanostructures 31p may correspond to the "first nanostructure" shown in FIG. 9. The plurality of first polymer nanostructures 31r and the plurality of second polymer nanostructures 31p in various shapes may be formed according to the shapes of the first pattern and the second pattern formed on the surface of the stamp 130.

Referring to FIG. 15, a metal material may be deposited on upper surfaces of the first polymer layer 30r, the second polymer layer 30q, and the third polymer layer 30p formed on the substrate SUB. For example, a metal material may be deposited on the upper surfaces of the first polymer layer 30r, the second polymer layer 30q, and the third polymer layer 30*p* through any one of plasma enhanced chemical vapor disposition (PECVD), sputtering, pulse laser deposition (PLD), and molecular ray epitaxy (MBE). However, the disclosure is not limited thereto, and the metal material may be deposited on the upper surfaces of the first polymer layer 30*r*, the second polymer layer 30*q*, and the third polymer layer 30*p* by various methods other than the above-described methods. The metal material may include, for example, Ag or an alloy containing Ag. Ag may have a property of being located in the first sub-surface area HA1, the second sub-surface area HA2, and the third sub-surface area HA3 having relatively high surface energy. Accordingly, Ag may be deposited on the first to third polymer layers 30*r*, 30*q*, and 30*p* provided in the first to third sub-surface areas HA1, HA2, and HA3, respectively.

Referring to FIG. 16, according to the method described above, the metasurface 70 may be formed through optional surface treatment for the substrate sub, forming the polymer layers 30*r*, 30*q*, and 30*r* through an imprint process and UV treatment for a UV curable resin, and forming the metal reflective layers 40*r*, 40*q*, and 40*p* through deposition of a metal material on upper surfaces of the polymer layers 30*r*, 30*q*, and 30*r*. The first and second metal reflective layers 40*r* and 40*q* may include the plurality of first and second metal nanostructures 41*r* and 41*q* having shapes corresponding to the plurality of first and second polymer nanostructures 31*r* and 31*p*, respectively. In this case, the plurality of first metal nanostructures 41*r* and the plurality of second metal nanostructures 41*p* may correspond to the "second nanostructures" shown in FIG. 9.

The metasurface 70 may include a plurality of double-layer structures located in each of the first sub-surface area HA1, the second sub-surface area HA2, and the third sub-surface area HA3. Each of the double-layer structures may include a structure in which the metal reflective layers 40*r*, 40*q*, and 40*p* are stacked on the polymer layers 30*r*, 30*q*, and 30*p*. In this way, the metasurface 70 may be formed by forming the polymer layers 30*r*, 30*q*, and 30*p* having desired shapes (e.g., the plurality of polymer nanostructures 31*r* and 31*q*) through an imprint process, and then forming the metal reflective layers 40*r*, 40*q*, and 40*p* having desired shapes (e.g., the plurality of metal nanostructures 41*r* and 41*q*) without etching by depositing a metal material on the polymer layers 30*r*, 30*q*, and 30*p*. The metasurface 70 formed in this way may have improved stability compared to a case formed through etching.

According to the method of fabricating the metasurface described above, a polymer layer including a polymer nanostructure is first formed through an imprint process, and a metal reflective layer including a metal nanostructure is formed on the polymer layer, thereby fabricating a metasurface with fewer defects.

In addition, by selectively performing surface treatment on a substrate to form a metasurface only in areas formed being spaced apart from each other on a substrate, a metasurface including a plurality of pixels that are electrically insulated and capable of independent driving, a light emitting device including a metasurface, and a display device including the light emitting device may be provided.

It should be understood that example embodiments described herein should be considered in a descriptive sense only and not for purposes of limitation. Descriptions of features or aspects within each of the example embodiments should typically be considered as available for other similar features or aspects in other embodiments. While one or more example embodiments have been described with reference to the figures, it will be understood by those of ordinary skill in the art that various changes in form and details may be made therein without departing from the spirit and scope as defined by the following claims.

What is claimed is:

1. A metasurface comprising:
    a substrate including a first surface area having first surface energy, and a second surface area surrounding the first surface area and having second surface energy less than the first surface energy;
    a polymer layer provided on the first surface area of the substrate and not provided on the second surface area, the polymer layer including a polymer material; and
    a metal reflective layer provided on the polymer layer and having a phase modulation surface including a metal material,
    wherein the first surface energy is hydrophilic and the second surface energy is hydrophobic, and
    wherein the polymer layer comprises a plurality of first columnar nanostructures and the metal reflective layer comprises a plurality of second columnar nanostructures.

2. The metasurface of claim 1, wherein the plurality of first columnar nanostructures are polymer nanostructures made of the polymer material.

3. The metasurface of claim 2, wherein the polymer nanostructures include a UV-curable resin.

4. The metasurface of claim 3, wherein the plurality of second columnar nanostructures are metal nanostructures corresponding to the polymer nanostructures.

5. The metasurface of claim 4, wherein the metal reflective layer includes silver (Ag) or an alloy containing Ag.

6. The metasurface of claim 1, wherein the first surface area includes a first sub-surface area and a second sub-surface area, which are spaced apart from each other by the second surface area.

7. The metasurface of claim 6,
    wherein the polymer layer includes a first polymer layer provided on the first sub-surface area and a second polymer layer provided on the second sub-surface area,
    wherein the first polymer layer includes a plurality of first polymer nanostructures arranged according to a first rule, and the second polymer layer includes a plurality of second polymer nanostructures arranged according to a second rule different from the first rule, and
    wherein the plurality of first polymer nanostructures and the plurality of second polymer nanostructures are made of the polymer material.

8. The metasurface of claim 7, wherein
    the metal reflective layer includes a first metal reflective layer covering the first polymer layer and a second metal reflective layer covering the second polymer layer, and
    a first phase modulation surface of the first metal reflective layer includes a plurality of first metal nanostructures corresponding to the plurality of first polymer nanostructures, and a second phase modulation surface of the second metal reflective layer includes a plurality of second metal nanostructures corresponding to the plurality of second polymer nanostructures.

9. The metasurface of claim 8, wherein
    the first surface area further includes a third sub-surface area,
    the polymer layer further includes a third polymer layer provided on the third sub-surface area, and
    the metal reflective layer further includes a third metal reflective layer provided on the third polymer layer and including a flat third phase modulation surface.

10. The metasurface of claim 1, wherein a first width of each of the plurality of first columnar nanostructures is less than a second width of each of the plurality of second columnar nanostructures.

11. A light emitting device comprising:
a polymer layer including a polymer material;
a metal reflective layer provided on the polymer layer and having a phase modulation surface including a metal material;
a first electrode provided on the metal reflective layer;
a light emitting structure provided on the first electrode; and
a second electrode provided on the light emitting structure,
wherein the polymer layer comprises a plurality of first columnar nanostructures and the metal reflective layer comprises a plurality of second columnar nanostructures,
wherein a first width of a planar upper surface of each of the plurality of first columnar nanostructures is less than a second width of a planar upper surface of each of the plurality of second columnar nanostructures, and
wherein the planar upper surface of each of the plurality of second columnar nanostructures is provided directly above the planar upper surface of a respective one of the plurality of second columnar nanostructures.

12. The light emitting device of claim 11, wherein the plurality of first columnar nanostructures are polymer nanostructures, and the plurality of second columnar nanostructures are metal nanostructures corresponding to the polymer nanostructures.

13. The light emitting device of claim 11, wherein the light emitting structure comprises:
a hole injection layer provided on the first electrode;
a hole transfer layer provided on the hole injection layer;
an organic emission layer provided on the hole transfer layer;
an electron transfer layer provided on the organic emission layer; and
an electron injection layer provided on the electron transfer layer.

14. The light emitting device of claim 11, wherein the first electrode is a transparent electrode, and the second electrode is a transflective electrode configured to reflect a portion of light and allow another portion of the light to pass through.

15. A display device providing a substrate including a first surface area including a first sub-surface area and a second sub-surface area having first surface energy, and a second surface area surrounding the first surface area and having second surface energy less than the first surface energy, the display device comprising:
a first pixel configured to emit light of a first wavelength provided on the first sub-surface area; and
a second pixel configured to emit light of a second wavelength provided on the second sub-surface area, the second wavelength being different from the first wavelength and is provided on the second sub-surface area,
wherein each of the first pixel and the second pixel comprises:
a polymer layer having a plurality of polymer columnar nanostructures;
a metal reflective layer provided on the polymer layer and having a phase modulation surface including a plurality of metal columnar nanostructures corresponding to the plurality of polymer nanostructures;
a first electrode provided on the metal reflective layer;
a light emitting structure provided on the first electrode; and
a second electrode provided on the light emitting structure,
wherein the first surface energy is hydrophilic and the second surface energy is hydrophobic.

16. The display device of claim 15, wherein
the first pixel and the second pixel are provided on the same plane of the substrate, and
the first pixel and the second pixel are spaced apart from each other by the second surface area such that the polymer layer and the metal reflective layer included in the first pixel and the polymer layer and the metal reflective layer included in the second pixel are electrically insulated from each other.

17. The display device of claim 15, wherein
the metal reflective layer and the second electrode form a micro-cavity having a resonance wavelength,
a first diameter and a first height of each of the plurality of metal columnar nanostructures included in the first pixel, and first arrangement intervals of the plurality of metal columnar nanostructures are configured based on a resonance wavelength of a first micro-cavity of the first pixel corresponds to the first wavelength, and
a second diameter and a second height of each of the plurality of metal columnar nanostructures included in the second pixel, and second arrangement intervals of the plurality of metal columnar nanostructures configured based on a resonance wavelength of a second micro-cavity of the second pixel corresponding to the second wavelength.

18. The display device of claim 15, wherein
the first surface area further includes a third sub-surface area, and
the display device further comprises a third pixel that emits light of a third wavelength different from the first and second wavelengths and is provided on the third sub-surface area,
wherein the third pixel comprises:
a third polymer layer including a polymer material and having a flat upper surface;
a third metal reflective layer provided on the polymer layer and having a flat phase modulation surface;
a third electrode provided on the metal reflective layer;
a third light emitting structure provided on the third electrode; and
a fourth electrode provided on the third light emitting structure.

19. The display device of claim 15, wherein a first density of the plurality of metal nanostructures in the first pixel is higher than a second density of the plurality of metal nanostructures in the second pixel.

* * * * *